US010727328B2

United States Patent
Wu et al.

(10) Patent No.: US 10,727,328 B2
(45) Date of Patent: Jul. 28, 2020

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Chao-Hsin Wu, Taipei (TW); Li-Cheng Chang, Taipei (TW); Cheng-Jia Dai, Taichung (TW); Shun-Cheng Yang, Taoyuan (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/951,988

(22) Filed: Apr. 12, 2018

(65) Prior Publication Data
US 2019/0165153 A1 May 30, 2019

Related U.S. Application Data

(60) Provisional application No. 62/593,151, filed on Nov. 30, 2017.

(51) Int. Cl.
*H01L 29/778* (2006.01)
*H01L 29/205* (2006.01)
(Continued)

(52) U.S. Cl.
CPC ...... *H01L 29/7786* (2013.01); *H01L 29/1029* (2013.01); *H01L 29/205* (2013.01);
(Continued)

(58) Field of Classification Search
CPC . H01L 29/7786; H01L 29/205; H01L 29/207; H01L 29/66462; H01L 29/785
See application file for complete search history.

(56) References Cited

U.S. PATENT DOCUMENTS

| 9,070,706 B2* | 6/2015 | Cho ................. H01L 29/66462 |
| 2012/0292665 A1* | 11/2012 | Marino .............. H01L 29/1029 |
| | | 257/194 |

(Continued)

FOREIGN PATENT DOCUMENTS

CN 105810728 A 7/2016

OTHER PUBLICATIONS

K. Im et al., "High-Performance GaN-Based Nanochannel FinFETs With/Without AlGaN/GaN Heterostructure," in IEEE Transactions on Electron Devices, vol. 60, No. 10, pp. 3012-3018, Oct. 2013 (Year: 2013).*

(Continued)

*Primary Examiner* — Mark W Tornow
(74) *Attorney, Agent, or Firm* — Maschoff Brennan (57) ABSTRACT

A semiconductor device includes a substrate, a channel layer, an active layer, and a gate electrode. The channel layer has a fin portion over the substrate. The active layer is over at least the fin portion of the channel layer. The active layer is configured to cause a two-dimensional electron gas (2DEG) to be formed in the channel layer along an interface between the channel layer and the active layer. The gate electrode is in contact with a sidewall of the fin portion of the channel layer.

20 Claims, 12 Drawing Sheets

(51) Int. Cl.
  *H01L 29/66* (2006.01)
  *H01L 29/207* (2006.01)
  *H01L 29/10* (2006.01)
  *H01L 29/78* (2006.01)

(52) U.S. Cl.
  CPC ...... *H01L 29/207* (2013.01); *H01L 29/66462* (2013.01); *H01L 29/7784* (2013.01); *H01L 29/7785* (2013.01); *H01L 29/785* (2013.01)

(56) References Cited

U.S. PATENT DOCUMENTS

2012/0319211 A1* 12/2012 van Dal ............ H01L 29/66795 257/401
2014/0103352 A1* 4/2014 Lee .................... H01L 29/7391 257/76

OTHER PUBLICATIONS

Y. Jo et al., "AlGaN/GaN FinFET With Extremely Broad Transconductance by Side-Wall Wet Etch," in IEEE Electron Device Letters, vol. 36, No. 10, pp. 1008-1010, Oct. 2015 (Year: 2015).*
E. Ture, P. Bruckner, R. Quay, O. Ambacher, M. Alsharef, R. Granzner, and F. Schwierz, "Enhancement-mode AlGaN/GaN FinFETs with high on/off performance in 100 nm gate length," in 2016 11th European Microwave Integrated Circuits Conference (EuMIC), Oct. 3-4, 2016 (Year: 2016).*
Dae-Hyun Kim et.al., "fT=688 GHz and fmax=800 GHz in Lg=40 nm In0.7Ga0.3As MHEMTs with gm_max > 2.7 mS/µm", 2011 IEEE (2011).
Dae-Hyun Kim et.al., "High-performance GaN-Based Nanochannel FinFETS with/without AlGaN/GaN Heterostructure" IEEE Transactions on Electron Devices, vol. 60, No. 10 2011 IEEE (2011).
Ki-Sik Im et.al., "High-Performance GaN-Based Nanochannel FinFETs With/Without AlGaN/GaN Heterostructure", IEEE Transactions on Electron Devices, vol. 60, No. 10, Oct. 2013.

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/593,151, filed Nov. 30, 2017, which is herein incorporated by reference.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-6B illustrating a method for forming HEMTs at various stages in accordance with some embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The HEMT or High Electron Mobility Transistor is a type of field effect transistor (FET), that is used to offer a combination of low noise figure and very high levels of performance at microwave frequencies. This is an important device for high speed, high frequency, digital circuits and microwave circuits with low noise applications. These applications include computing, telecommunications, and instrumentation. And the device is also used in RF design, where high performance is required at very high RF frequencies. A HEMT structure includes a channel layer and an active layer. A two-dimensional electron gas (2-DEG) is generated in the channel layer, adjacent an interface with the active layer. The 2-DEG is used in the HEMT structure as charge carriers. The 2-DEG is generated even in the absence of a voltage applied to the HEMT structure. Thus, a HEMT structure is, by nature, a normally ON structure with a negative threshold voltage. A consideration in designing circuitry for power applications involves converting a normally ON HEMT structure to a normally OFF HEMT structure with a positive threshold voltage.

Figure 1:
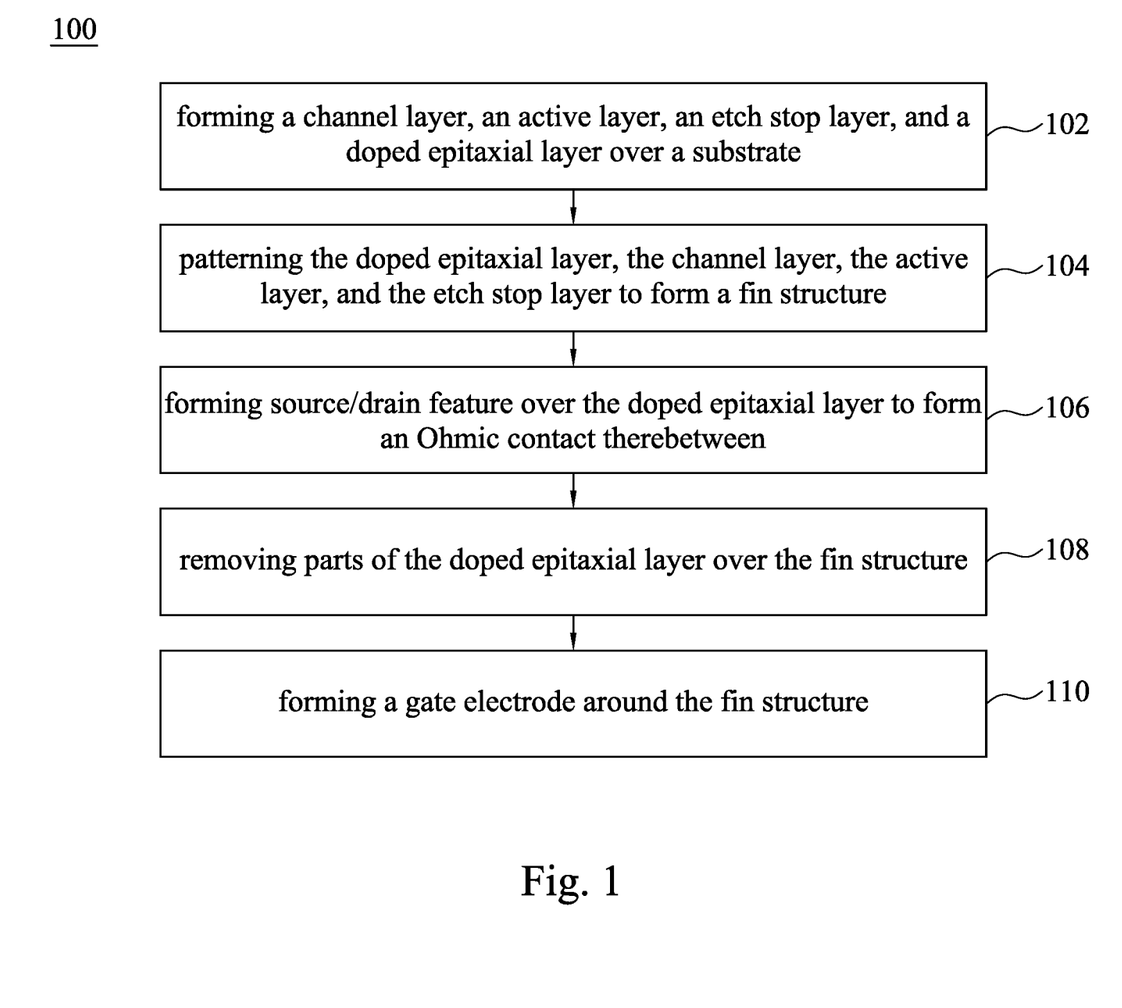
FIG. 1 is a flow chart of a method of forming high electron mobility transistors (HEMTs) in accordance with some embodiments of the present disclosure.

FIG. 1 is a flow chart of a method 100 of forming HEMTs in accordance with some embodiments of the present disclosure. FIGS. 2-6B illustrate a method 100 for forming HEMTs at various stages in accordance with some embodiments of the present disclosure. The illustration is merely exemplary and is not intended to be limiting beyond what is specifically recited in the claims that follow. It is understood that additional operations may be provided before, during, and after the operations shown by FIG. 1, and some of the operations described below can be replaced or eliminated for additional embodiments of the method. The order of the operations/processes may be interchangeable.

Figure 2:
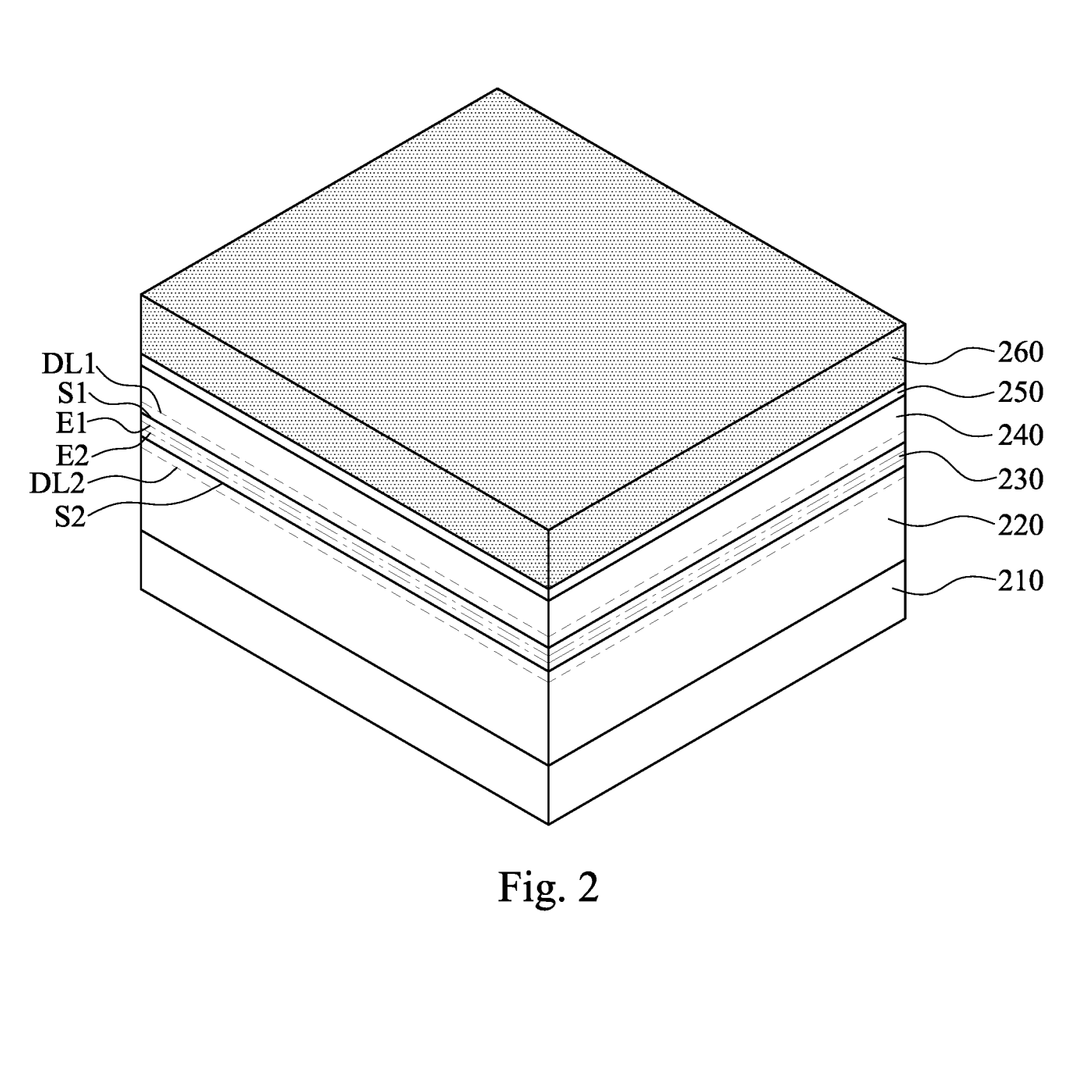

Referring to FIG. 2, the method 100 begins at operation 102 where a buffer layer 220, a channel layer 230, an active layer 240, an etch stop layer 250, and a doped epitaxial layer 260 are sequentially formed over a substrate 210.

The substrate 210 may be a semiconductor substrate, such as a bulk semiconductor, a semiconductor-on-insulator (SOI) substrate, or the like. The substrate 210 may be a wafer, such as a gallium arsenic wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The buffer layer 220 may include one or more III-V semiconductor compound layers. The buffer layer 220 may have a lattice structure and/or a thermal expansion coefficient (TEC) suitable for bridging the lattice mismatch and/or the TEC mismatch between the substrate 210 and an overlying layer, such as the channel layer 230. For example, the buffer layer 220 is made of $Al_xGa_{(1-x)}As$, and the channel layer 230 is made of $In_yGa_{(1-y)}As$, in which the x and y are in a range from about 0 to about 1, respectively. In some embodiments, the buffer layer 220 is not intentionally doped, for example, not having intentionally placed dopants, but rather having a doping resulting from process contaminants. In some embodiments, the buffer layer 220 may be omitted.

The channel layer 230 and the active layer 240 may include one or more III-V semiconductor compound layers, while the compositions of the channel layer 230 and the active layer 240 are different. For example, the channel layer 230 is made of $In_yGa_{(1-y)}As$, and the active layer 240 is made of $Al_zGa_{(1-z)}As$, in which y and z are in a range from about 0 to about 1, respectively. The active layer 240 has a band gap wider than that of the channel layer 230. Thus, a heterojunction is formed between the active layer 240 and the channel layer 230. At the heterointerface, a large conduction band discontinuity occurs, such that the free electrons diffuse from higher bandgap active layer 240 into lower bandgap channel layer 230 and two-dimensional electron gas (2-DEG) is formed. Herein, the active layer 240 may include a δ-doping layer DL1 (e.g., Si δ-doping layer, Ge δ-doping layer, or a δ-doping layer containing other n-type semiconductor materials in III-V semiconductors) adjacent and spaced apart from the channel layer 230 to supply electron carriers to the channel layer 230. The δ-doping layer DL1 is indicated by a dashed line. Thus, a thin layer E1 of highly mobile conducting electrons is provided in the channel layer 230. This thin layer E1 is also referred to as 2-DEG, and forms a carrier channel (also referred to as the carrier channel E1). The thin layer E1 of 2-DEG is located adjacent to an interface S1 of the active layer 240 and the channel layer 230. The thin layer E1 is indicated by a dash-dotted line. The channel layer 230 and the active layer 240 is not intentionally doped, for example, not having intentionally placed dopants, but rather having a doping resulting from process contaminants. The carrier channel has high electron mobility because the channel layer 230 is undoped or unintentionally doped, and the electrons can move freely without collision or with substantially reduced collisions with impurities.

In some embodiments, when the compositions of the channel layer 230 and the buffer layer 220 are different, the buffer layer 220 may optionally include a δ-doping layer DL2 (e.g., Si δ-doping layer, Ge δ-doping layer, or a δ-doping layer containing other n-type semiconductor materials in III-V semiconductors) abutting the channel layer 230, thereby forming another thin layer E2 of 2-DEG in the channel layer 230, in which the another thin layer E2 of 2-DEG is adjacent to the interface S2 between the buffer layer 220 and the channel layer 230. The δ-doping layer DL2 is indicated by a dashed line. The thin layer E2 is indicated by a dash-dotted line. It is noted that, in some embodiments, the δ-doping layer DL2 and the thin layer 2E may be omitted.

Since the growing layer would have the same crystal structure with the underlying layer, the semiconductor layers 220-240 have the same crystal structure. In some embodiments, the buffer layer 220 (e.g., AlGaAs), the channel layer 230 (e.g., InGaAs), and the active layer 240 (e.g., AlGaAs) are made of III-V semiconductors that have ZB crystal structure, which do not include polar facet, and the δ-doping layers DL1 and DL2 facilitate the formation of the 2-DEG in these III-V semiconductors layers. In some other embodiments where the buffer layer 220, the channel layer 230, and the active layer 240 are made of III-V semiconductors that have wurtzite crystal structure, which includes polar facets, 2-DEG may be formed without δ-doping layers. In some embodiments, the buffer layer 220, the channel layer 230, and the active layer 240 may include III-nitride semiconductors. For example, the buffer layer 220 includes aluminum gallium nitride (AlGaN), the channel layer 230 includes gallium nitride GaN, and the active layer 240 includes aluminum gallium nitride (AlGaN). In these embodiments, through the polar facets, the electrons from a piezoelectric effect in the active layer 240 drop into the channel layer 230, and thus create the thin layers E1 and E2 of highly mobile conducting electrons in the channel layer 230.

The etch stop layer 250 may include one or more III-V semiconductor compound layers that have the same crystal structure with the underlying active layer 240. For example, the etch stop layer 250 may include aluminum asernide (AlAs). The thickness of the etch stop layer 250 is in a range of 1 to 10 nanometers, such as 4 nanometers. The thickness of the etch stop layer 250 is designed to be capable of stopping a later etching process.

The doped epitaxial layer 260 over the etch stop layer 250 may be made of suitable III-V semiconductor compound layer(s) doped with suitable dopant, which is capable to form an ohmic contact with metals in subsequent process. The doped epitaxial layer 260 may have the same crystal structure with the underlying etch stop layer 250. For example, the doped epitaxial layer 260 may include GaAs. The doped epitaxial layer 260 may be aluminum-free. In some embodiments, the doped epitaxial layer 260 is in-situ doped by an n-type dopant, such as, but not limited to, silicon, oxygen, or a combination thereof. The doped epitaxial layer 260 may have an n-type impurity concentration higher than about $10^{18}/cm^3$. In some embodiments, the doped epitaxial layer 260 is in-situ doped by a p-type dopant, such as, but not limited to, magnesium, calcium, zinc, beryllium, carbon, and combinations thereof. The doped epitaxial layer 260 may have a p-type impurity concentration higher than about $10^{18}/cm^3$. The terms "in-situ doped" or "in-situ doping" in this context means that the epitaxial layers are doped during their epitaxy growth. In some other embodiments, the dopants can be implanted into the grown epitaxial layer, instead of in-situ doping.

The semiconductor layers 220-260 may be formed by a suitable deposition process, such as chemical vapor deposition (CVD), low pressure CVD (LPCVD), atmospheric pressure CVD (APCVD), ultrahigh vacuum CVD (UHVCVD), atomic layer deposition (ALD), molecular layer deposition (MLD), plasma enhanced CVD (PECVD), metal-organic CVD (MOCVD), molecular beam epitaxy (MBE), sputter deposition, the like, or combinations thereof.

Figure 3A:
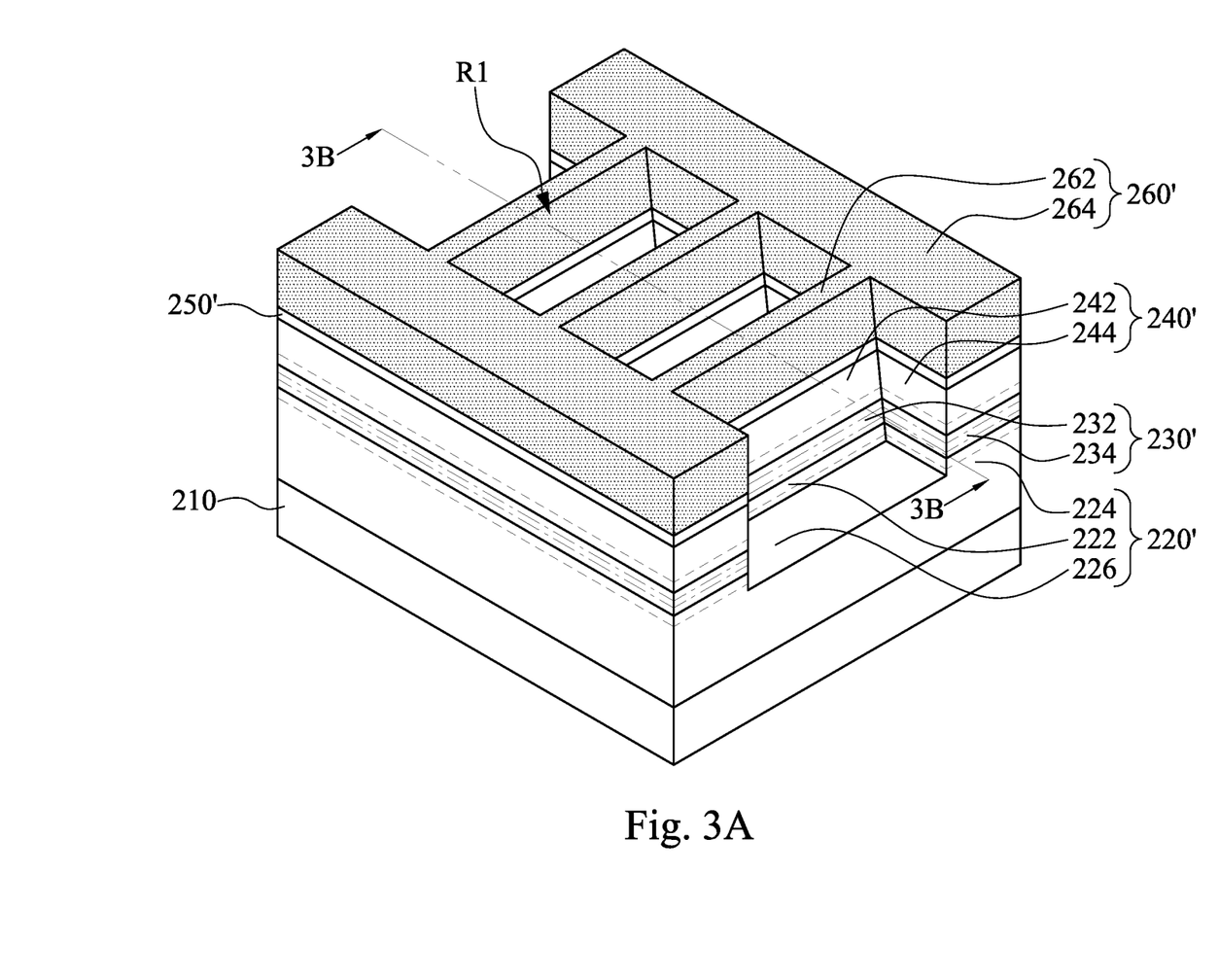
Figure 3B:
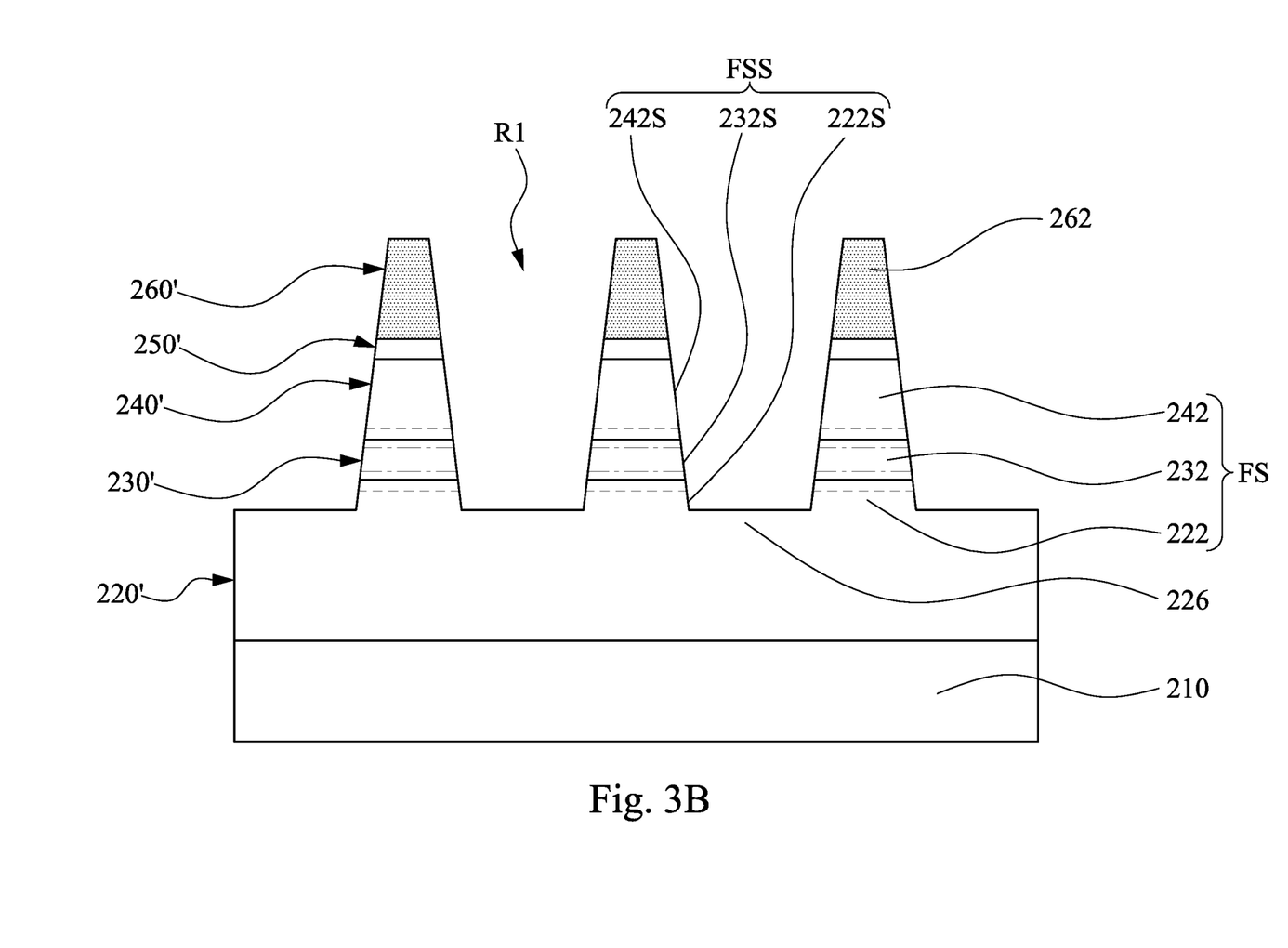

Referring to FIGS. 3A and 3B, FIG. 3B is a cross-sectional view taken along line 3B-3B of FIG. 3A. The method 100 proceeds to operation 104 where the doped epitaxial layer 260, the etch stop layer 250, the active layer 240, and the channel layer 230 are patterned, such that plural recesses R1 are formed. In some embodiments, a patterned mask is formed over the doped epitaxial layer 260 to define positions where the recesses R1 are to be formed. Then, an etch process is performed to remove portions of the doped epitaxial layer 260, the etch stop layer 250, the active layer 240, and the channel layer 230 exposed by the patterned mask. The etch process may use a chloride-based or fluoride based etchant, such as BCl$_3$/Ar. The patterned mask has a higher etch resistance to the etch process than that of the doped epitaxial layer 260, the etch stop layer 250, the active layer 240, and the channel layer 230. Remaining portions of the doped epitaxial layer 260, the etch stop layer 250, the active layer 240, and the channel layer 230 protected by the patterned mask are referred to as doped epitaxial layer 260', the etch stop layer 250', the active layer 240', and the channel layer 230', respectively, hereinafter. In some embodiments, a portion of the buffer layer 220 may also be etched away and recessed, and the remaining portion of the buffer layer 220 is referred to as the buffer layer 220' hereinafter. In some other embodiments, the buffer layer 220 may remain intact, instead of being recessed.

After the patterning, the doped epitaxial layer 260' includes fin portions 262 and side portions 264, and opposite ends of each of the fin portions 262 are connected to the side portions 264, respectively. The active layer 240' includes fin portions 242 and side portions 244, and opposite ends of each of the fin portions 242 are connected to the side portions 244, respectively. The channel layer 230' includes fin portions 232 and side portions 234, and opposite ends of each of the fin portions 232 are connected to the side portions 234, respectively. The buffer layer 220' includes fin portions 222, side portions 224, and recessed portion 226, and opposite ends of each of the fin portions 222 are connected to the side portions 224, respectively. The recesses R1 separate a stack of fin portions 222, 232, 242, and 262 from another stack of fin portions 222, 232, 242, and 262. The fin portions 222, 232, and 242 have sidewalls 222S, 232S, and 242S exposed to the recesses R1, respectively. Herein, a combination of the fin portions 222, 232, and 242 is referred to as fin structures FS, which has fin sidewalls FSS including the sidewalls 222S, 232S, and 242S. After the patterning process, an etch process may be performed to remove the patterned mask.

Figure 4:
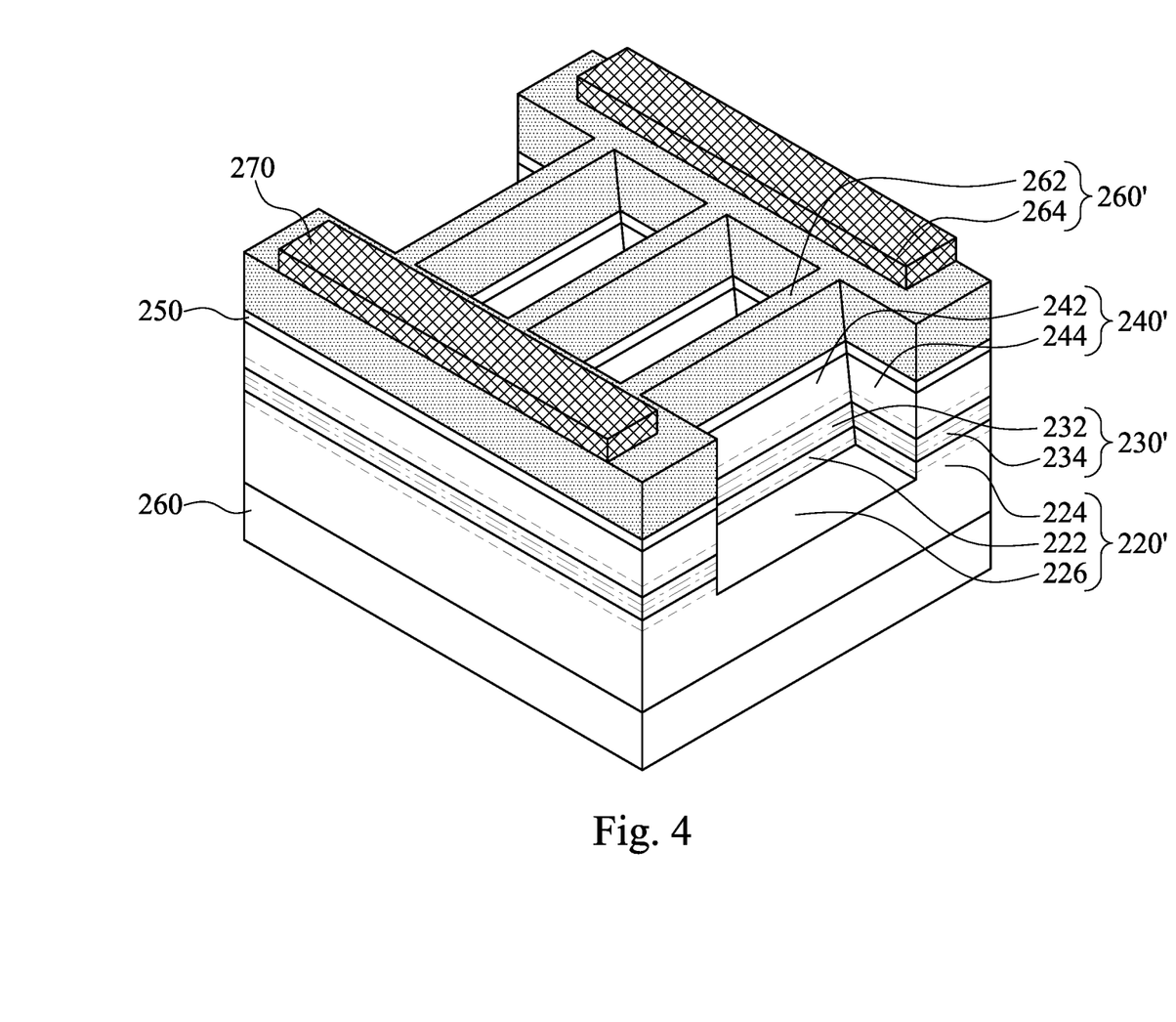

Referring to FIG. 4, the method 100 proceeds to operation 106 where the source/drain features 270 are formed over the side portions 264 of the doped epitaxial layer 260', respectively. The source/drain features 270 include Au, Ge, Ni, Au, or the combination thereof. The formation of the source/drain features 270 includes depositing a metal layer on the structure of FIG. 3A, and then patterning the metal layer to form the source/drain feature 270. The metal layer can be deposited by a process such as physical vapor deposition (PVD) or other proper technique.

The formation of the source/drain features 270 may be followed by a thermal annealing process applied to the source/drain features 270. Through the thermal annealing process, the doped epitaxial layer 260' and the source/drain features 270 in contact with the doped epitaxial layer 260' react with each other to activate the implanted dopants in the doped epitaxial layer 260 and form an alloy for effective electrical connection from the source/drain features 270 to the channel. For example, a rapid thermal annealing (RTA) process is performed at a temperature ranging from 100° C. to 400° C. in a nitrogen atmosphere. The anneal process may be performed in an atmosphere of an inert gas such as N$_2$ or Ar. Furthermore, the anneal process may be performed in an atmosphere of NH$_3$. Through the annealing process, ohmic contacts are formed between the source/drain contacts 270 and the doped epitaxial layer 260'. As used herein, the term "ohmic contact" means it has a linear voltage-current curve.

Figure 5A:
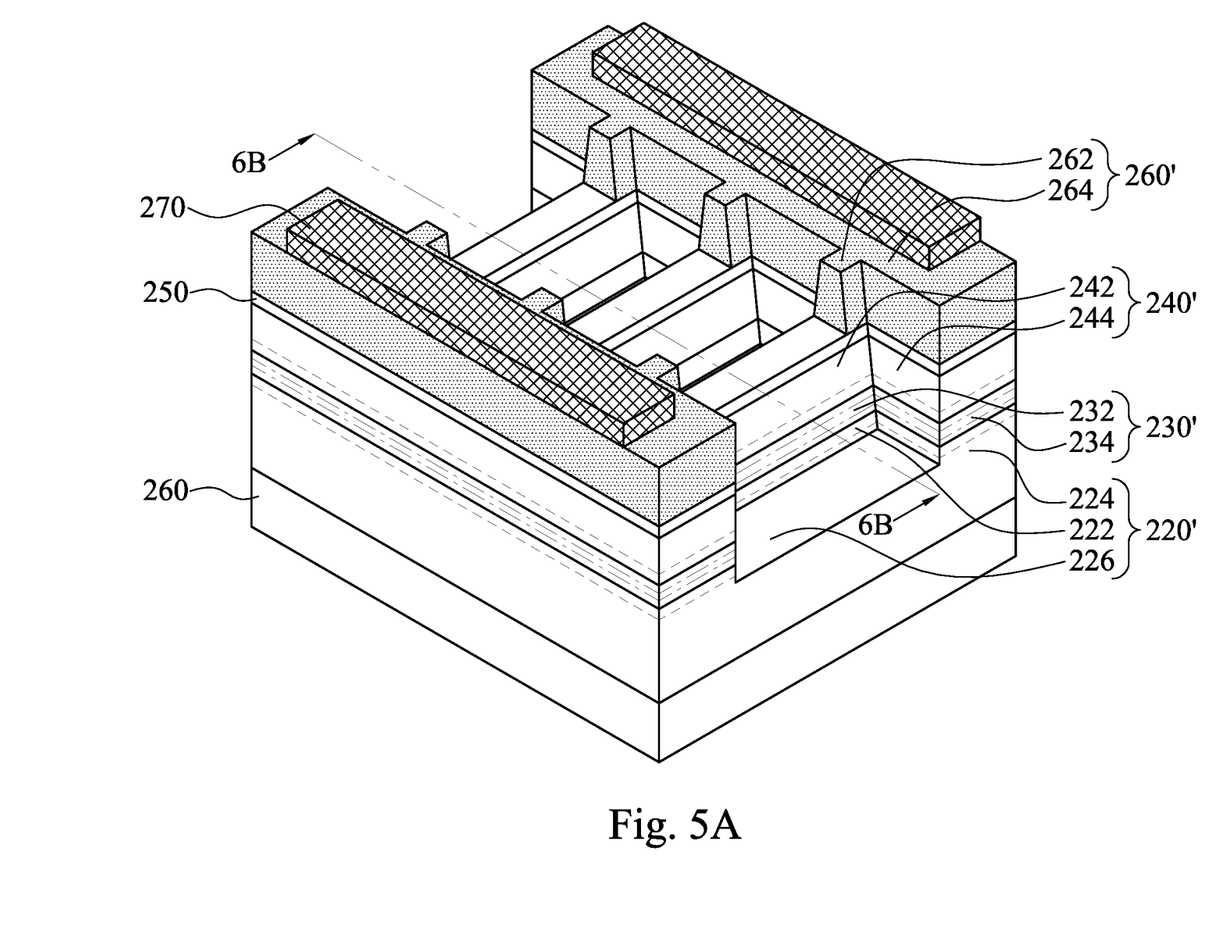
Figure 5B:
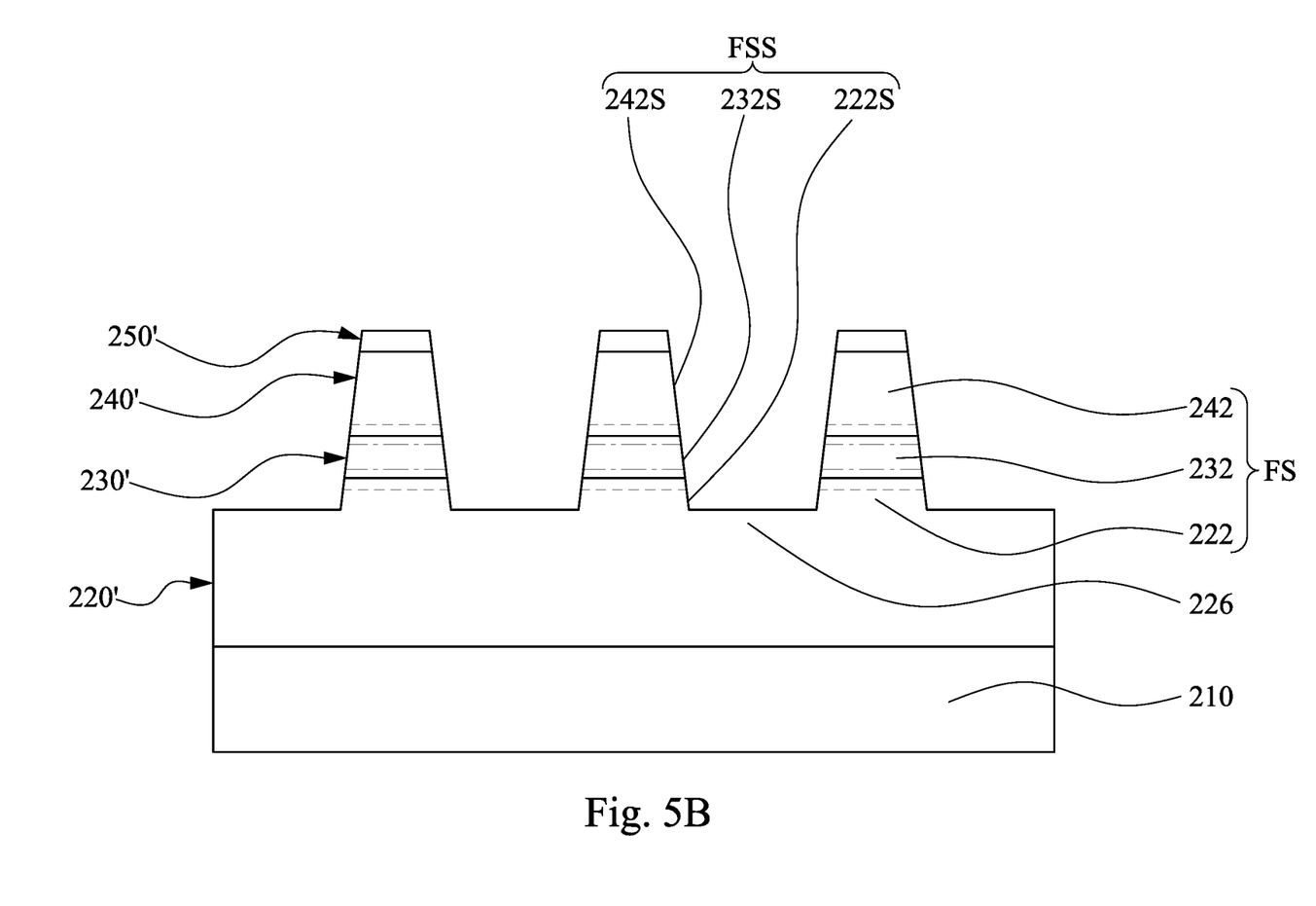

Referring to FIGS. 5A and 5B, FIG. 5B is a cross-sectional view taken along line 5B-5B of FIG. 5A. The method 100 proceeds to operation 108 where parts of the fin portions 262 of the doped epitaxial layer 260' are removed, such that the etch stop layer 250' and the fin structures FS have portions uncovered by the doped epitaxial layer 260'.

In some embodiments, a patterned mask may be formed over the doped epitaxial layer 260, and then an etch process is performed to remove parts of the fin portions 262 of the doped epitaxial layer 260' exposed by the patterned mask. The etch process may use a suitable etchant, such as citric acid. The patterned mask has a higher etch resistance to the etch process than that of the doped epitaxial layer 260', such that other parts of the fin portions 262 and the side portions 264 covered by the patterned mask remain intact. The etch stop layer 250 has a higher etch resistance to the etch process than that of the doped epitaxial layer 260' and the underlying layers (e.g., the active layer 240', the channel layer 230', and the buffer layer 220'), such that the etch process is stopped by the etch stop layer 250.

Figure 6A:
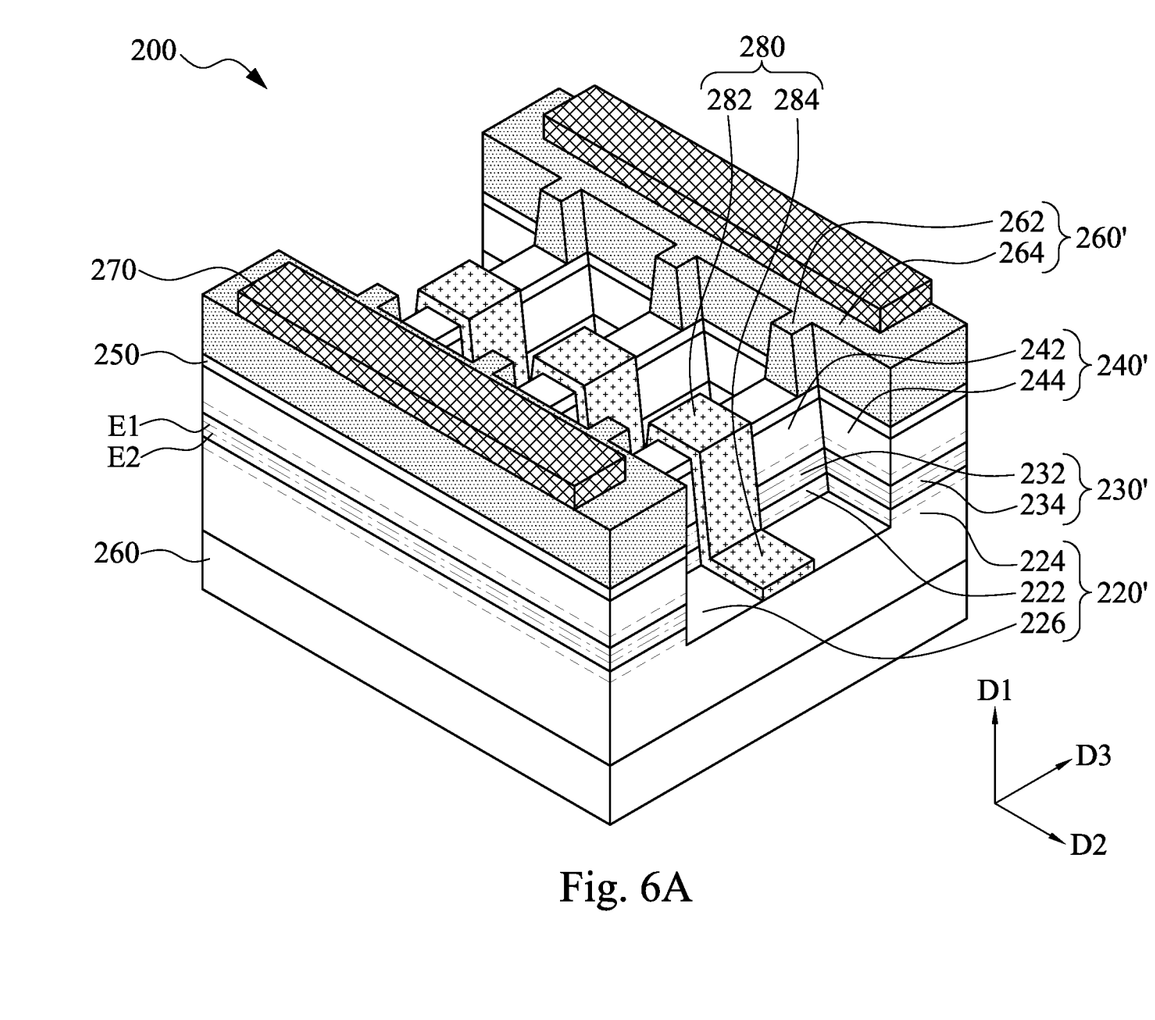
Figure 6B:
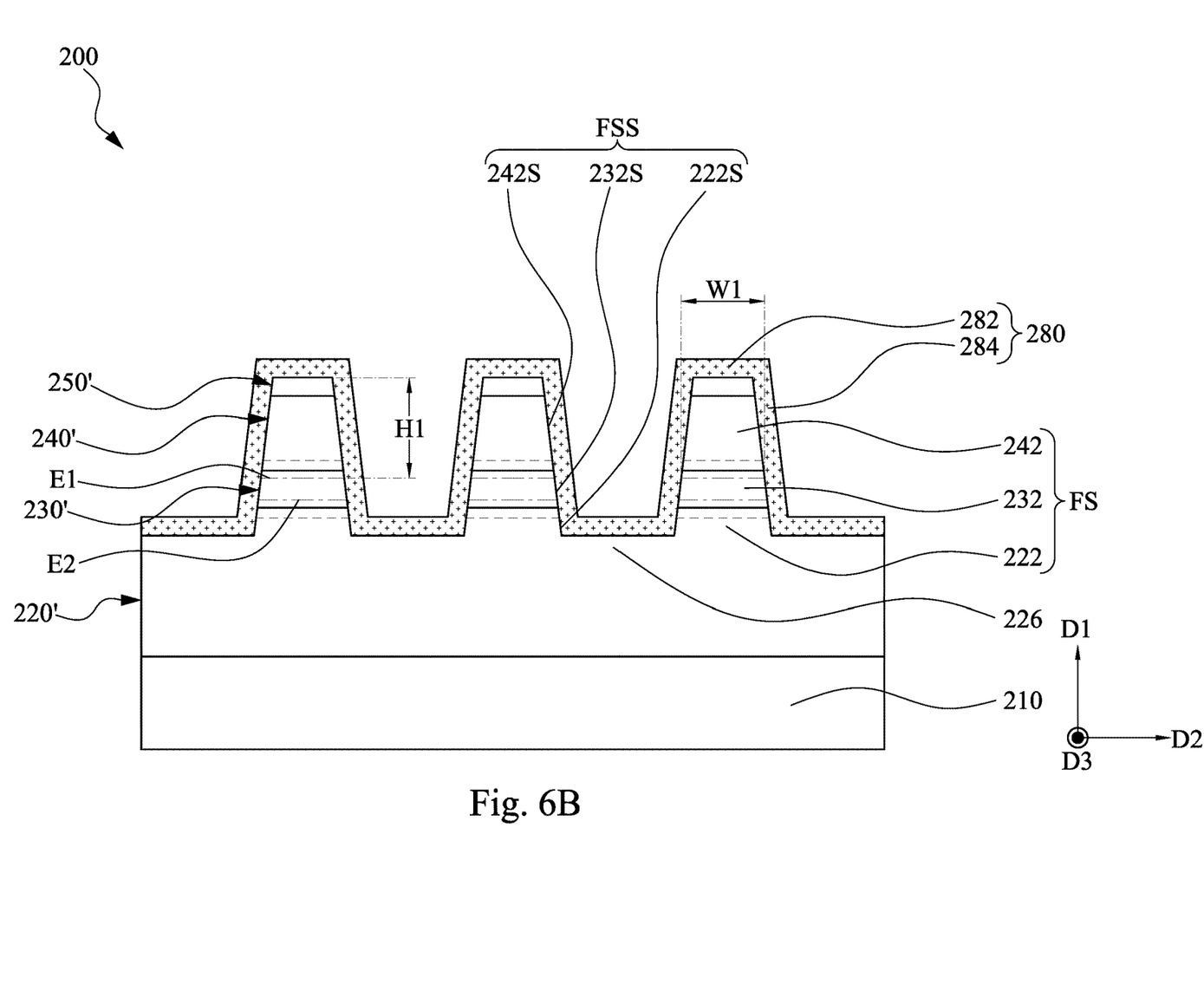

Referring to FIGS. 6A and 6B, FIG. 6B is a cross-sectional view taken along line 6B-6B of FIG. 6A. The method 100 proceeds to operation 110 where a gate electrode 280 is formed around the fin structures FS. The gate electrode 280 includes Ti, Pt, Au, or the combination thereof. The formation of the gate electrode 280 includes depositing a metal layer on the structure of FIGS. 5A and 5B, and then patterning the metal layer to form the gate electrode 280. The gate electrode 280 represents a Schottky contact associated with a Schottky barrier. A Schottky barrier is formed at a metal-semiconductor junction, which in this case is located at the junction of the layers 220'/230'/240' and the gate electrode 280. The Schottky barrier causes the gate electrode 280 to form a blocking or Schottky contact, meaning it has a non-linear and asymmetric voltage-current curve.

To be specific, the gate electrode 280 has top portions 282 over the fin structures FS and side portions 284 surround the fin structures FS. The side portions 284 of the gate electrode 280 are designed to be in contact with the sidewalls 232S of the channel layer 230', such that Schottky barriers are formed at the junctions of the side portions 284 and the channel layer 230'. Furthermore, in some embodiments, the side portions 284 of the gate electrode 280 are in contact with the fin sidewalls FSS of the fin structures (i.e., the sidewalls 222S-242S), and Schottky barrier is formed at the junction of the side portions 284 and the layers 220'/240'. However, it should not limit the scope of the present disclosure. In some other embodiments, the side portions 284 of the gate electrode 280 may not be in contact with the sidewalls 222S or 242S.

In the present embodiments, the etch stop layer 250' separates the top portion 282 of the gate electrode 280 from the fin structure FS. However, it should not limit the scope of the present disclosure, and in some other embodiments, the etch stop layer 250' over the fin structure FS may be removed, and the top portion 282 of the gate electrode 280 may be in contact with the fin structure FS. In some embodiments, Schottky barrier is also formed between the top portions 282 and the active layer 240'.

As shown in FIGS. 6A and 6B, HEMTs 200 are formed. Depletion regions are formed in the fin structures FS. The depletion regions may block the thin layer E1/E2 of 2-DEG in the channel layer 230'. A depleted width at zero gate bias may be calculated according to the materials of the gate electrode 280 and the channel layer 230'. For example, in the present embodiments, the depleted width may be 100 nanometers at zero gate bias. By applying voltage onto the gate electrode 280, the depletion regions narrows or widens, thereby turning on/off the HEMTs 200.

In some embodiments, the top portions 282 of the gate electrode 280 is configured to cause the depletion region to extend from a top of the channel layer 230' further into a bottom of the channel layer 230', while the side portions 284 is configured to cause the depletion region of the Schottky barrier to extend from opposite sidewalls 232S of the channel layer 230' further into the middle to the channel layer 230'. That is, the depletion of the thin layer E1 may occurs along the vertical direction D1 by the top portions 282 of the gate electrode 280 and along the horizontal direction D2 by the side portions 284 of the gate electrode 280, and electrons may transmit in the direction D3 in the thin layer E1. Thus, electrons may transmit from one source/drain feature 270 through the thin layer E1 to another source/drain feature 270.

In some embodiments, the width and height of the fin structure are designed such that the side portions 284 of the gate electrode 280 are more dominant than the top portion 282 of the gate electrode 280 in these operations. For example, when the fin width W1 get thinner, the thin layer E1 is depleted more by the side portions 284 of the gate electrode 280 than by the top portions 282 of the gate electrode 280. For example, the fin width W1 may be less than half a distance H1 between the top portion 282 and the thin layer E1. In some embodiments, the fin width W1 is designed to be less than twice the depleted width at zero gate bias (e.g. 100 nanometers), such that the depletion region induced by the side portions 284 may extend in the whole channel layer 230' in OFF-state, and gradually reduces with increasing gate bias. For example, the fin width W1 may be 40 to 80 nanometers. Thus, the transistor has a large threshold voltage and is normally OFF, and an E-mode HEMT is realized.

In some embodiments, the width and height of the fin structure are designed such that the top portion 282 of the gate electrode 280 is more dominant than the side portions 284 of the gate electrode 280 in these operations. For example, when the fin width W1 get wider, the thin layer E1 is depleted more by the top portions 282 of the gate electrode 280 than by the side portions 284 of the gate electrode 280. For example, in some embodiments, the fin width W1 is designed to be greater than twice the depleted width at zero gate bias (e.g. 100 nanometers), such that the transistor has a small threshold voltage and is normally ON. For example, the fin width W1 may be 100 to 400 nanometers. Herein, the fin width W1 is illustrated as the horizontal length of the thin layer E1. However, in some embodiments, the fin width W1 may be referred to as a horizontal length of the thin layer E2. In some embodiments, the fin width W1 may be referred to as a horizontal length of the bottom surface of the fin portion 232 of the channel layer 230'. In some embodiments, the HEMT 200 may include two doping layers DL1 and DL2, which serve as the source of electrons, and may be called double δ-doped HEMT. The operations of the thin layer E2 which is optionally formed are similar to those of thin layer E1, and not repeated herein.

Figure 7:
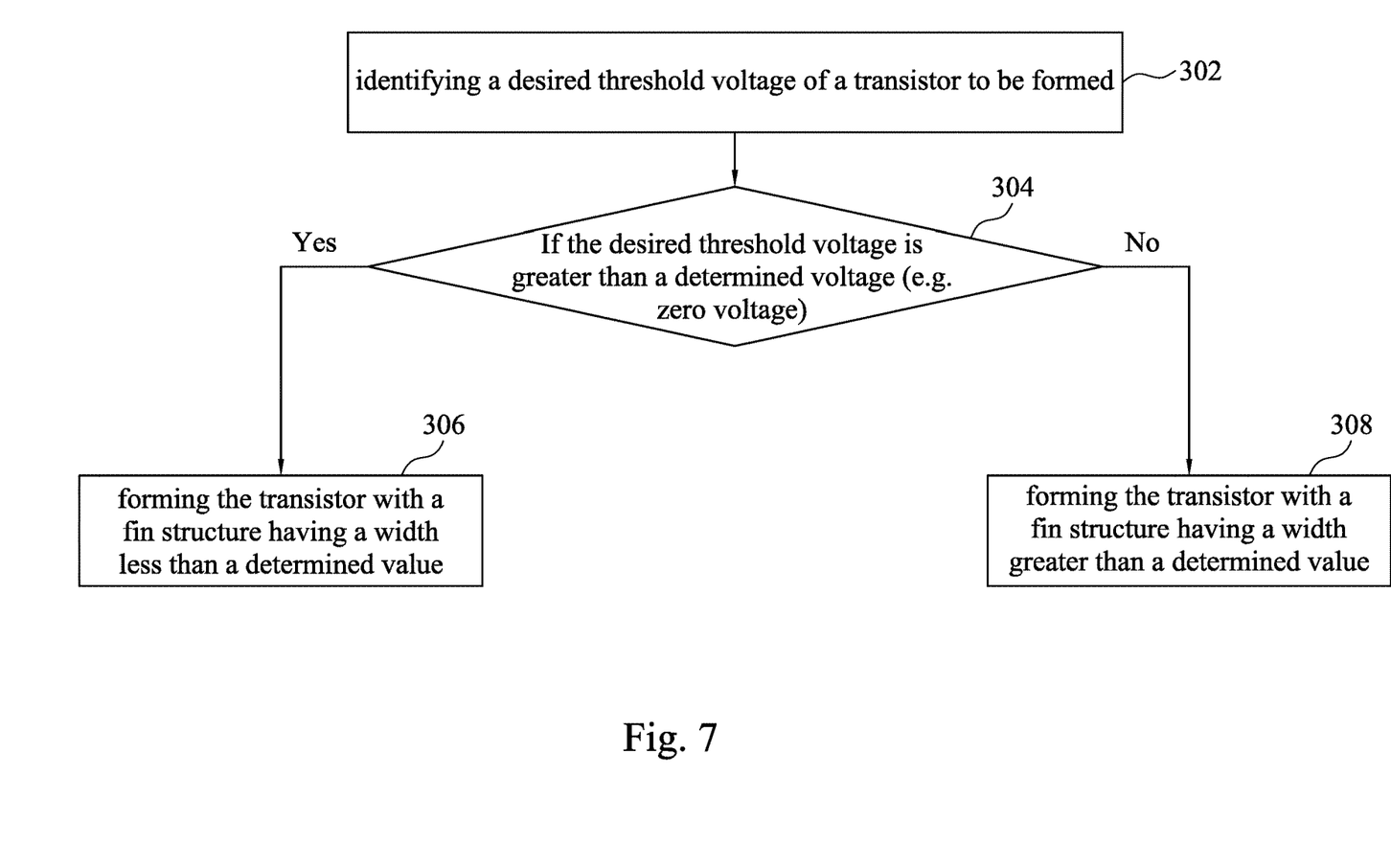
FIG. 7 is a flow chart of a method of forming a semiconductor device in accordance with some embodiments of the present disclosure.

FIG. 7 is a flow chart of a method 300 of forming a semiconductor device in accordance with some embodiments of the present disclosure. The method 300 includes steps 302-308. It is understood that additional steps may be provided before, during, and after the steps shown by FIG. 7, and some of the steps described below can be replaced or eliminated for additional embodiments of the method. The order of the steps/processes may be interchangeable.

Figure 8:
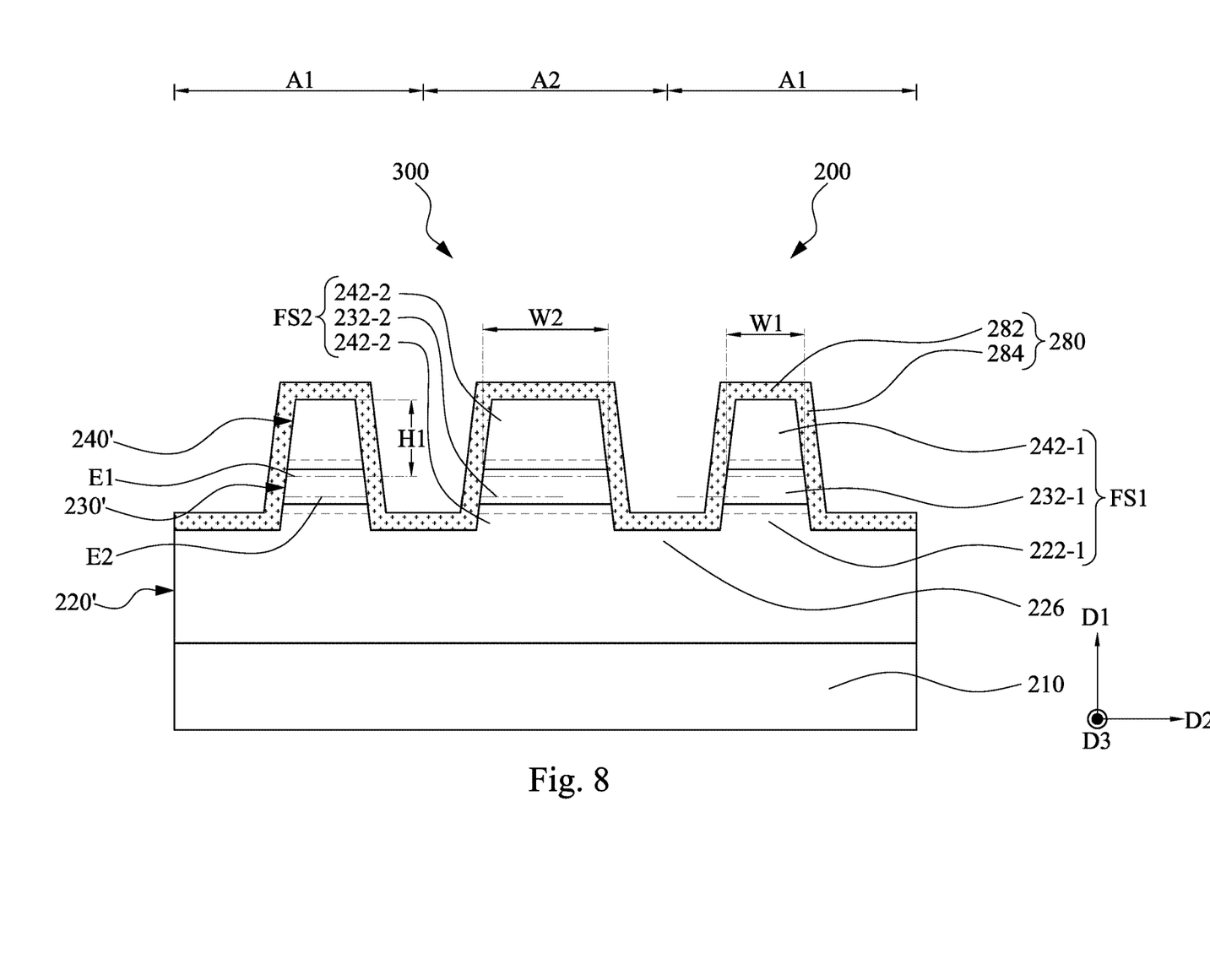
FIG. 8 is a cross-sectional view of a semiconductor device in accordance with some embodiments of the present disclosure.

FIG. 8 is a cross-sectional view of a semiconductor device in accordance with some embodiments of the present disclosure. Reference is made both to FIGS. 7 and 8. At step 302, a desired threshold voltage of a transistor (e.g., HEMT) to be formed is identified. For example, it is designed that a transistor with a high threshold voltage to be formed in a first region A1 of the substrate 210, and a transistor with a low threshold voltage to be formed in a second region A2 of the substrate 210. At step 304, the desired threshold voltage is compared with a determined voltage (e.g. zero voltage). If the desired threshold voltage is greater than the determined voltage, the method 300 proceeds to step 306, where the transistor is formed with a fin structure having a width less than a determined value (e.g. twice the depleted width, such as 100 nanometers). For example, a HEMT 200 is formed with a fin structure FS1 has a width W1 less than twice the depleted width. Alternatively, if the desired threshold voltage is not greater than the determined voltage, the method 300 proceeds to step 308, where the transistor is formed with a fin structure having a width greater than a determined value (e.g. twice the depleted width, such as 100 nanometers). For example, a HEMT 400 is formed with a fin structure FS2 has a width W2 greater than twice the depleted width.

Through these steps, the semiconductor device includes the HEMT 200 and the HEMT 400 in the first region A1 and the second region A2 of the substrate 210, respectively. As illustrated previously, the HEMTs 200 and 400 respectively include fin structures FS1 and FS2. The fin structure FS1 includes fin portions 222-1, 232-1, and 242-1. The fin structure FS2 includes fin portions 222-2, 232-2, and 242-2. The fin portions 222-1 and 222-2 are formed from the buffer layer 220'. The fin portions 232-1 and 232-2 are formed from the channel layer 230'. The fin portions 242-1 and 242-2 are formed from the active layer 240'. In some embodiments, the fin structure FS1 has a width W1 less than a width W2 of the fin structure FS2, and the HEMT 200 has a greater threshold voltage than that of the HEMT 400. For example, when the width W1 is less than 100 nanometers and the width W2 is greater than 100 nanometers, the HEMT 200 is normally OFF, while the HEMT 400 is normally ON.

Figure 9:
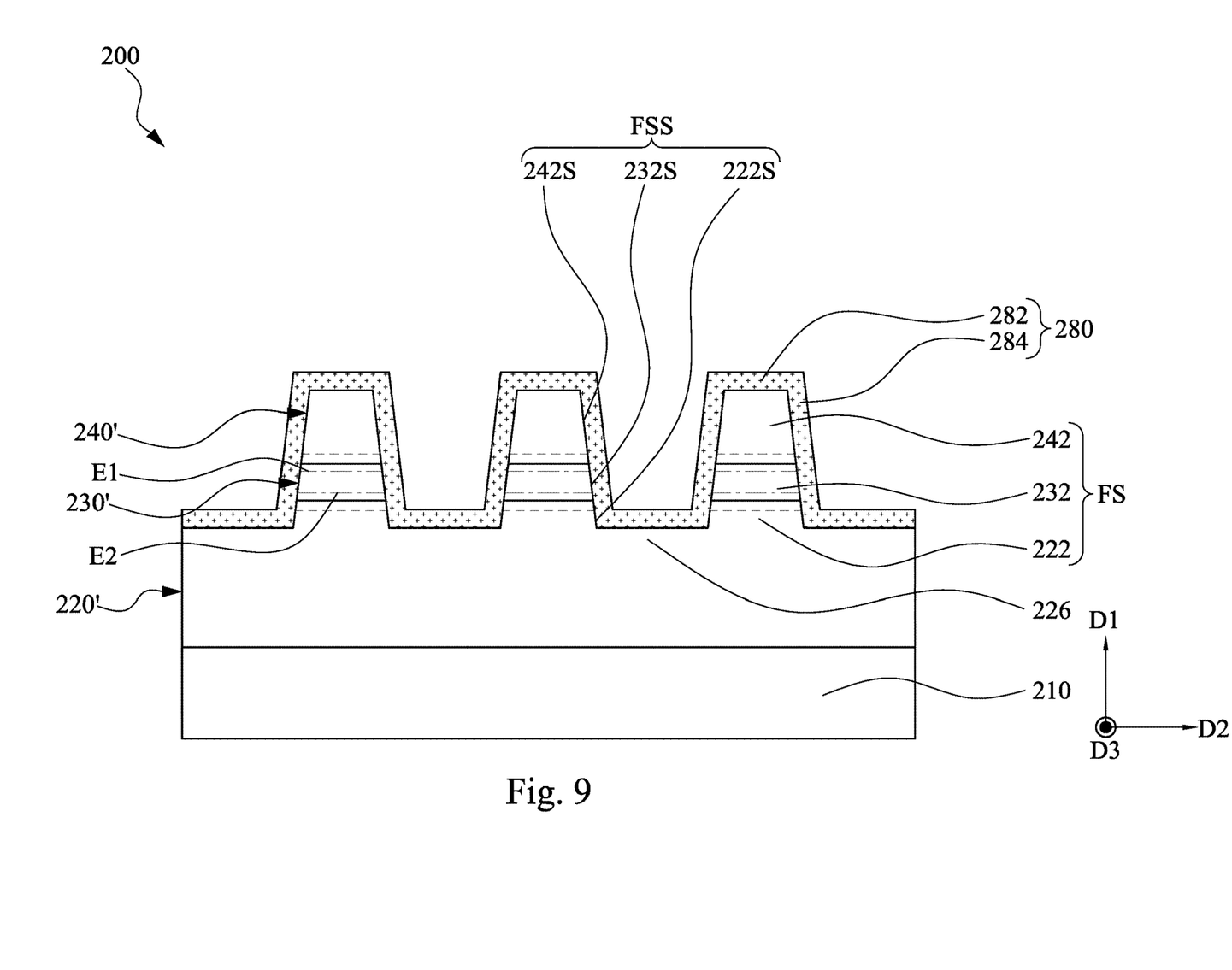
FIG. 9 is a cross-sectional view of HEMTs in accordance with some embodiments of the present disclosure.

FIG. 9 is a cross-sectional view of HEMTs in accordance with some embodiments of the present disclosure. The present embodiments are similar to that of FIGS. 6A and 6B, and the difference between the present embodiments and that of FIGS. 6A and 6B is that the etch stop layer 250' (referring to FIGS. 6A and 6B) is removed in the present embodiments. The top portion 282 of the gate electrode 280 may be in contact with tops of the fin portions 242 of the active layer 240'. Thus, Schottky barrier is formed at the junction of the side portions 284 and the fin portion 232 of the channel layer 230', and at the junction of the top portions 282 and the fin portion 242 of the active layer 240'. Other details of the present embodiments are similar to that of the previous embodiments, and not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a Schottky barrier is built between a gate electrode and a sidewall of a fin structure, so as to increase modulation efficiency by omitting a gate dielectric layer, compared with a metal-insulator-semiconductor structure. Another advantage is that through the depletion extending from the sidewall of the fin structure, a normally ON HEMT is realized. Yet another advantage is that a threshold voltage or an operation mode (normally OFF/ON) of the transistor may be adjusted by tuning a width of the fin structure.

According to some embodiments of the present disclosure, a semiconductor device includes a substrate, a channel layer, an active layer, and a gate electrode. The channel layer has a fin portion over the substrate. The active layer is over at least the fin portion of the channel layer. The active layer is configured to cause a two-dimensional electron gas (2DEG) to be formed in the channel layer along an interface between the channel layer and the active layer. The gate electrode is in contact with a sidewall of the fin portion of the channel layer.

In some embodiments, the active layer has a fin portion over the fin portion of the channel layer, and the gate electrode is further in contact with a sidewall of the fin portion of the active layer.

In some embodiments, the channel layer further comprises a side portion on a side of the fin portion, the semiconductor device further includes a source/drain feature over the side portion of the channel layer.

In some embodiments, the semiconductor device further includes a doped epitaxial layer between the source/drain feature and the side portion of the channel layer.

In some embodiments, the semiconductor device further includes an etch stop layer between the doped epitaxial layer and the side portion of the channel layer.

In some embodiments, the source/drain feature is in contact with the doped epitaxial layer.

In some embodiments, the active layer includes a δ-doping layer adjacent the channel layer.

In some embodiments, the semiconductor device further includes a buffer layer between the substrate and the channel layer.

In some embodiments, the buffer layer includes a δ-doping layer adjacent the channel layer.

In some embodiments, the buffer layer has a fin portion below the fin portion of the channel layer, and the gate electrode is further in contact with a sidewall of the fin portion of the buffer layer.

According to some embodiments of the present disclosure, a semiconductor device includes a substrate and first and second transistors over the substrate. The first transistor has a first fin structure including a first channel layer and a first active layer over the first channel layer. The second transistor has a second fin structure including a second channel layer and a second active layer over the second channel layer. The first fin structure has a width less than that of the second fin structure, and the first transistor has a threshold voltage greater than that of the second transistor.

In some embodiments, the first transistor further comprises a gate electrode in contact with a sidewall of the first channel layer.

In some embodiments, the second transistor further comprises a gate electrode in contact with a sidewall of the second channel layer.

In some embodiments, the first active layer comprises a δ-doping layer adjacent the channel layer.

In some embodiments, the second active layer comprises a δ-doping layer adjacent the channel layer.

According to some embodiments of the present disclosure, a method of manufacturing a semiconductor device includes forming a channel layer and an active layer over a substrate; patterning the channel layer and the active layer to form a fin structure; and forming a gate electrode around the fin structure to form a Schottky barrier between the gate electrode and the fin structure.

In some embodiments, the method further includes forming a doped epitaxial layer over the active layer, wherein the patterning the channel layer and the active layer comprises patterning the doped epitaxial layer; and removing a portion of the patterned doped epitaxial layer over the fin structure before forming the gate electrode.

In some embodiments, the method further includes forming a source/drain feature over the patterned doped epitaxial layer before removing the portion of the patterned doped epitaxial layer such that an Ohmic contact is formed between the source/drain feature and the patterned doped epitaxial layer.

In some embodiments, the method further includes forming a etch stop layer over the active layer before forming the doped epitaxial layer, wherein removing the portion of the patterned doped epitaxial layer comprises performing an etch process to the doped epitaxial layer, wherein the etch stop layer has a higher etch resistance to the etching process than that of the doped epitaxial layer.

In some embodiments, forming the gate electrode is performed such that the gate electrode is in contact with a sidewall of the patterned channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a channel layer having a fin portion over the substrate;
   an active layer over at least the fin portion of the channel layer, the active layer configured to cause a two-dimensional electron gas (2DEG) to be formed in the channel layer along an interface between the channel layer and the active layer; and
   a gate electrode in direct contact with a sidewall of the fin portion of the channel layer and a top surface of the active layer.

2. The semiconductor device of claim 1, wherein the active layer has a fin portion over the fin portion of the channel layer, and the gate electrode is further in contact with a sidewall of the fin portion of the active layer.

3. The semiconductor device of claim 1, wherein the channel layer further comprises a side portion on a side of the fin portion, the semiconductor device further comprising:
   a source/drain feature over the side portion of the channel layer.

4. The semiconductor device of claim 3, further comprising
   a doped epitaxial layer between the source/drain feature and the side portion of the channel layer.

5. The semiconductor device of claim 4, further comprising a III-V semiconductor compound layer between the doped epitaxial layer and the side portion of the channel layer.

6. The semiconductor device of claim 4, wherein the source/drain feature is in contact with the doped epitaxial layer.

7. The semiconductor device of claim 1, wherein the active layer comprises a δ-doping layer adjacent the channel layer.

8. The semiconductor device of claim 1, further comprising:
a buffer layer between the substrate and the channel layer.

9. The semiconductor device of claim 8, wherein the buffer layer comprises a δ-doping layer adjacent the channel layer.

10. The semiconductor device of claim 8, wherein the buffer layer has a fin portion below the fin portion of the channel layer, and the gate electrode is further in contact with a sidewall of the fin portion of the buffer layer.

11. A semiconductor device, comprising:
a substrate;
a buffer layer over the substrate and having a horizontal portion and first and second fin portions extending upwards from a top of the horizontal portion;
a first transistor over the substrate and having a first fin structure comprising the first fin portion of the buffer layer, a first channel layer over the first fin portion of the buffer layer, a first active layer over the first channel layer, and a first gate electrode in direct contact with a sidewall of the first channel layer, a sidewall of the first fin portion of the buffer layer, and the top of the horizontal portion of the buffer layer, wherein the buffer layer and the first channel layer comprise different materials; and
a second transistor over the substrate and having a second fin structure comprising the second fin portion of the buffer layer, a second channel layer over the second fin portion of the buffer layer, and a second active layer over the second channel layer, wherein the first fin structure has a width less than that of the second fin structure, and the first transistor has a threshold voltage greater than that of the second transistor.

12. The semiconductor device of claim 11, wherein the second transistor further comprises a gate electrode in direct contact with a sidewall of the second channel layer.

13. The semiconductor device of claim 11, wherein the first active layer comprises a δ-doping layer adjacent the first channel layer.

14. The semiconductor device of claim 11, wherein the second active layer comprises a δ-doping layer adjacent the second channel layer.

15. A semiconductor device, comprising:
a substrate;
a channel layer over the substrate;
an active layer over the channel layer, wherein the active layer is configured to cause a two-dimensional electron gas (2DEG) to be formed in the channel layer along an interface between the channel layer and the active layer;
a III-V semiconductor compound layer over the active layer;
a gate electrode extending from the substrate to above the III-V semiconductor compound layer, wherein the active layer has a first portion covered by the gate electrode and a second portion that is free from coverage by the gate electrode; and
a doped epitaxial layer over the second portion of the active layer.

16. The semiconductor device of claim 15, wherein the gate electrode extends to above the first portion of the active layer.

17. The semiconductor device of claim 15, wherein the gate electrode is in contact with the substrate.

18. The semiconductor device of claim 15, wherein the gate electrode is in contact with the channel layer.

19. The semiconductor device of claim 15, wherein
the III-V semiconductor compound layer is between the second portion of the active layer and the doped epitaxial layer.

20. The semiconductor device of claim 15, wherein the gate electrode is in contact with a top surface of the III-V semiconductor compound layer.

* * * * *